US006210541B1

(12) United States Patent
Cooney, III et al.

(10) Patent No.: US 6,210,541 B1
(45) Date of Patent: Apr. 3, 2001

(54) PROCESS AND APPARATUS FOR COLD COPPER DEPOSITION TO ENHANCE COPPER PLATING FILL

(75) Inventors: Edward C. Cooney, III, Jericho; Josef W. Korejwa, Charlotte; David C. Strippe, Westford, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/067,454

(22) Filed: Apr. 28, 1998

(51) Int. Cl.[7] ............................ C23C 14/34; C23C 16/06; C23C 16/46
(52) U.S. Cl. ............................ 204/192.15; 204/192.13; 204/298.09; 427/250; 427/252; 118/725
(58) Field of Search ........................ 204/192.1, 192.12, 204/192.15, 298.09, 298.03, 192.13, 192.25; 118/724, 725, 716; 427/569, 535, 250, 252

(56) References Cited

U.S. PATENT DOCUMENTS

| | | | |
|---|---|---|---|
| 3,767,551 | 10/1973 | Lang, Jr. et al. | 204/192.12 |
| 3,897,325 | 7/1975 | Aoshima et al. | 204/298.06 |
| 4,013,539 | * 3/1977 | Kuehnle | 204/298.09 |
| 4,859,304 | 8/1989 | Cathey et al. | 204/298.31 |
| 5,171,412 | 12/1992 | Talieh et al. | 204/192.15 |
| 5,298,687 | 3/1994 | Rapoport et al. | 174/261 |
| 5,342,471 | * 8/1994 | Fukasawa et al. | 204/298.09 |
| 5,372,848 | 12/1994 | Blackwell et al. | 427/250 |
| 5,427,670 | * 6/1995 | Baggerman et al. | 204/298.09 |
| 5,509,557 | 4/1996 | Jimarez et al. | 216/95 |
| 5,525,780 | * 6/1996 | Moslehi | 118/725 |
| 5,595,637 | 1/1997 | Tench et al. | 205/91 |
| 5,597,458 | 1/1997 | Sanchez, Jr. et al. | 204/192.3 |
| 5,602,053 | 2/1997 | Zheng et al. | 438/600 |
| 5,648,125 | 7/1997 | Cane | 427/534 |
| 5,658,438 | 8/1997 | Givens et al. | 204/192.11 |

OTHER PUBLICATIONS

Shyam P. Murarka et al. "Copper Metallization for USLI and Beyond" Critical Reviews in Solid State and Material Sciences, 20(2); pp. 87–124, 1995.*

* cited by examiner

Primary Examiner—Nam Nguyen
Assistant Examiner—Gregg Cantelmo
(74) Attorney, Agent, or Firm—Ratner & Prestia; Howard J. Walter, Jr., Esq (57) ABSTRACT

A process and apparatus for depositing thin films onto a substrate. The process comprises mounting a wafer onto a wafer chuck and pumping a cryogenic fluid through the chuck which cools the wafer chuck and the wafer to a temperature below about +20° C. A thin film is then deposited over the cooled wafer using a sputter deposition process while maintaining the temperature of the wafer chuck and the wafer below about +20° C. The preferred embodiment of the present invention includes the use of liquid nitrogen as the cryogenic fluid, and copper as the material to be deposited through the sputtering process. In addition, the preferred embodiment cools the wafer chuck and the wafer to a temperature of about −100° C. The apparatus includes the physical vapor deposition vessel, the wafer chuck, the source of material to be deposited, the wafer, and the cooling line which passes through the wafer chuck to carry the cooling fluid to the chuck.

14 Claims, 13 Drawing Sheets

PROCESS AND APPARATUS FOR COLD COPPER DEPOSITION TO ENHANCE COPPER PLATING FILL

FIELD OF THE INVENTION

The present invention relates generally to physical vapor deposition processes. More particularly, this invention describes a process and apparatus for sputtering copper onto a substrate at very low temperatures.

BACKGROUND OF THE INVENTION

A common process step in the manufacture of integrated circuits is the deposition of one or more metallic layers onto the surface of a semiconductor wafer or substrate. Typically, holes, known as trenches and vias, exist on the surface of, and extend into, the substrate. The interior walls of these holes create vertical, or nearly vertical, surfaces with respect to the horizontal surfaces of the top of the substrate and the bottom of each hole. Both these vertical surfaces and the horizontal surface must be covered with a thin film of metal. Several processes have evolved to accomplish the metal film deposition step.

Although several processes exist to form the metal films, a typical process involves physical vapor deposition—or "sputter deposition." In such a process, one or more metal layers are deposited onto a substrate. A typical sputtering process begins with a "target" comprising the material which the operator wishes to deposit onto a substrate. This target is then bombarded with ions to form a vapor comprised of the freed atoms of the target. The vapor is then allowed to contact the substrate and form the desired thin film. Using conventional sputter deposition processes, the vapor typically reaches temperatures of 250° C. to 430° C.

One example of the current processes used for sputter deposition is disclosed in U.S. Pat. No. 5,597,458, issued to Sanchez, Jr. et al. That patent discloses a sputtering process in which an aluminum-copper (Al—Cu) alloy is deposited onto a substrate. Because there are two main phases of copper-aluminum in the alloy, namely $CuAl_2$ and an aluminum rich "matrix" phase which forms the actual (and desired) thin film, it is an object of the '458 patent to reduce the formation of the $CuAl_2$ phase. Specifically, the '458 patent seeks to provide a process for controlling the size, distribution, and morphology of the $CuAl_2$ phase during the sputter deposition of Al—Cu films. According to the '458 patent, to prevent the solid state diffusion of copper, and thereby reduce the formation of $CuAl_2$, the temperature of the wafer is maintained at about room temperature, specifically about 25° C. By maintaining this temperature during deposition, the copper in the deposited film is less likely to diffuse and form the undesired, more thermodynamically stable, $CuAl_2$.

Operating the deposition process at room temperature is generally effective in cases like the one above. Several problems have arisen, however, with regard to thin film continuity. The temperature of the substrate during copper thin film deposition significantly affects the ability of the copper to form a continuous film.

Under current typical manufacturing conditions, when the substrate is allowed to reach temperatures of 100° C. or higher, the copper particles agglomerate. Agglomeration is the build-up of metal particles when they strike other metal particles and bind to each other. Consequently, poor plating and uneven seedlayer continuity results. When the seedlayer is discontinuous, the subsequent plating steps result in discontinuous and other non-uniform, undesired, surface irregularities. This is particularly noticeable where trenches and voids are present in the substrate, and especially where those trenches and voids have high aspect ratios. The aspect ratio is the ratio of the longer side to the shorter side of the opening. In the case of "deep" voids and trenches, the aspect ratio is the ratio of the depth of the opening to the width of the opening. Thus, a trench or void with a high aspect ratio is one which is relatively deep and not relatively wide. A square trench has an aspect ratio of 1.

High aspect ratio structures make it particularly difficult to produce an even and continuous copper thin film. This is so because, during conventional deposition processes, copper atoms tend to agglomerate at the trench opening and along the trench walls and effectively "clog" the via or trench. The result is a trench which is unevenly coated, or not coated, in certain areas. That problem is then compounded when a secondary layer is applied, such as an electrolytic plating layer.

The deficiencies of the conventional manufacturing techniques show that a need still exists for a process and apparatus which will effectively and reliably sputter a continuous, relatively defect-free layer of copper onto a substrate, especially a substrate with high aspect ratio structures. Therefore, one object of the present invention is to provide a process and apparatus to effectively sputter a copper seedlayer onto a substrate while preventing the copper from agglomerating. Another object of the present invention is to provide an effective process and apparatus to effectively sputter a copper seedlayer onto a substrate having high aspect ratio structures while preventing the copper from agglomerating.

SUMMARY OF THE INVENTION

To achieve these and other objects, and in view of its purposes, the present invention provides a process and apparatus to sputter a copper seedlayer onto a semiconductor substrate having high aspect ratio structures. The system is cooled to nearly cryogenic temperatures and the sputtering process is carried out at these temperatures. Cryogenic temperatures for purposes of this invention are defined as those temperatures at or below 110°K. (or −163° C.). More specifically, the present invention provides a process and apparatus for depositing metallic materials onto a substrate in which a wafer is mounted onto a wafer chuck; a cryogenic fluid is pumped through the chuck, causing the wafer chuck and wafer to cool to a temperature less than about +20° C., and preferably below about −100° C.; and a metallic material is deposited over the super-cooled substrate using a sputter deposition process while maintaining the temperature at less than about +20° C., and preferably below about −100° C.

It is to be understood that both the foregoing general description and the following detailed description are exemplary, but are not restrictive, of the invention.

DESCRIPTION OF THE DRAWING

The invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

As discussed above, a typical process of sputtering copper onto a wafer to form a copper seedlayer occurs in a physical vapor deposition chamber maintained at temperatures above 25° C. Such temperatures allow agglomeration of copper particles to occur during deposition. That agglomeration causes a discontinuous seedlayer, which in turn creates discontinuity of the subsequent electrolytic plating. This is especially true where the aspect ratios of structures on the wafer exceed 3:1. That is, where the depth of the trench or via is more than three times its width, reliable electrolytic plating is not achieved.

Figure 1:
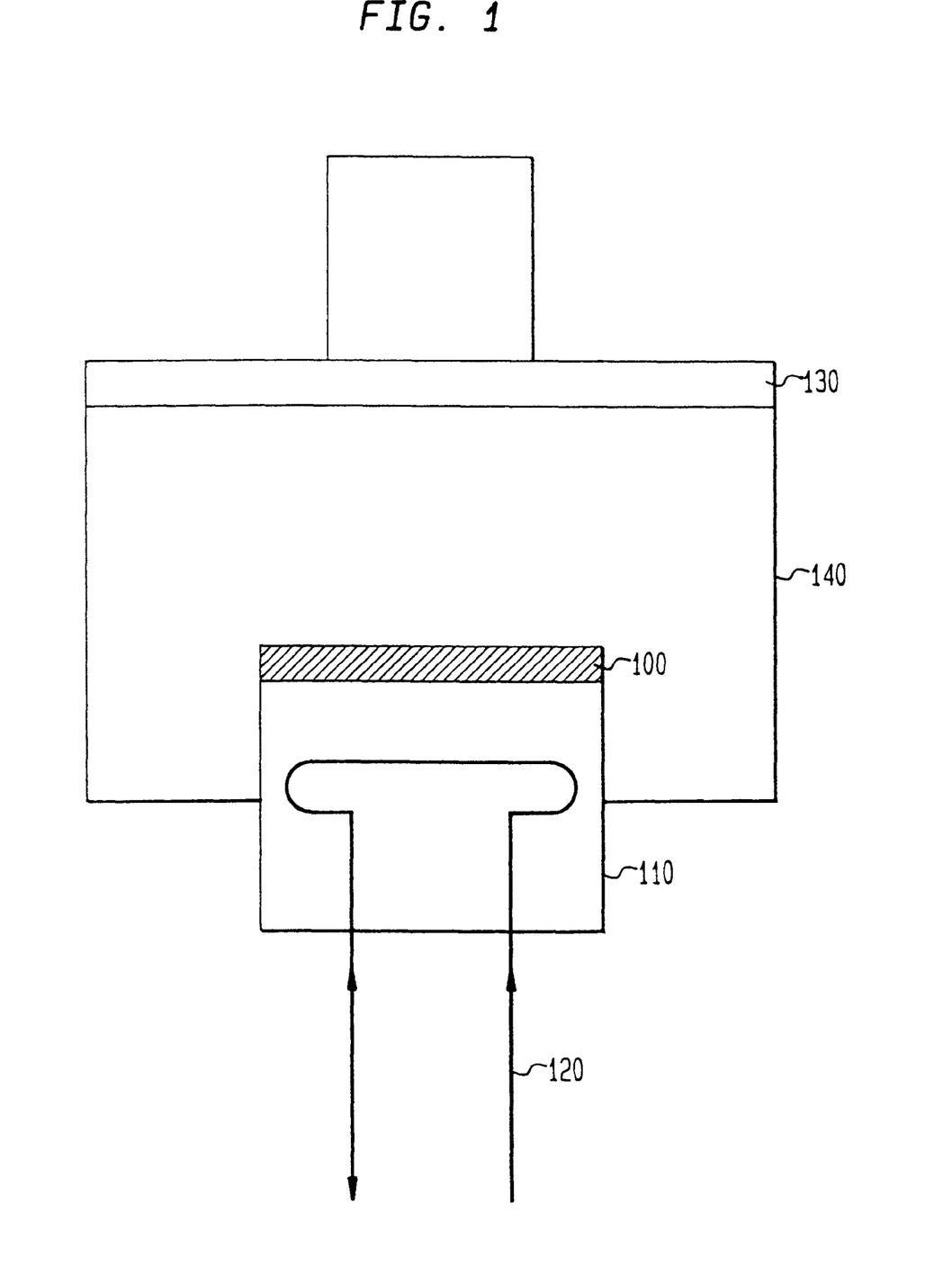
FIG. 1 is a schematic view of the process and apparatus of the present invention.

To resolve these problems, the present invention provides a process and apparatus to sputter a copper seedlayer onto a wafer at nearly cryogenic temperatures, thereby forming a continuous, smooth copper seedlayer. FIG. 1 illustrates, schematically, the present invention. A wafer 100 is placed onto a wafer chuck 110. Mechanisms for attaching the wafer 100 to the wafer chuck 110 are well known to those skilled in the art, and the present invention would include any of such mechanisms.

Super-cooling fluid is pumped, via cooling line 120, through wafer chuck 110. This fluid cools the wafer chuck 110 and wafer 100 to below about −25° C. and, preferably, to about −100° C. In the preferred embodiment, liquid nitrogen is the super-cooling fluid. Although liquid nitrogen works well, other cooling fluids may be used, such as glycol, glycol-water mixtures, or product gases from a cryopump compressor. Once the near-cryogenic temperatures are reached, the sputter deposition process is conducted. The copper source 130 is located at a distance across from the wafer 100 and wafer chuck 110 within the deposition chamber 140.

The wafer chuck 110 may be constructed of any suitable material. In the preferred embodiment, the wafer chuck 110 is constructed of stainless steel, which is a good. thermal conductor. Other suitable choices for the wafer chuck 110 would include Hastelloy® C (Hastelloy® C is a nickel-chromium-molybdenum-tungsten alloy, and Hastelloy® is a trademark owned by Union Carbide of New York, N.Y.) or aluminum. One drawback of aluminum is, however, that it has a relatively large coefficient of thermal expansion. Heat transfer through the wafer 100, through the wafer chuck 110, through the wall of the coolant line 120, and all interfaces between those components, must be maximized to efficiently cool the wafer 100. Thus, the selection of materials for these components must be made with those considerations in mind.

The actual physical vapor deposition process takes place within the deposition chamber 140. Copper source 130 is disposed above wafer 100 and supplies the copper to be sputtered onto wafer 100.

When the copper deposition was performed on the wafer 100 maintained at below about −25° C., the morphology of the seedlayer was found to be significantly smoother and less discontinuous than previously observed when the deposition occurred at temperatures above 0° C. The inventors believe that the improved morphology is a result of the colder temperatures restricting the mobility of the copper atoms as they are deposited. Copper is known to have excellent mobility at room temperature, and the inventors believe that this mobility at room temperature is enough to allow unacceptable levels of agglomeration during the seedlayer formation in conventional processes.

Figure 2:
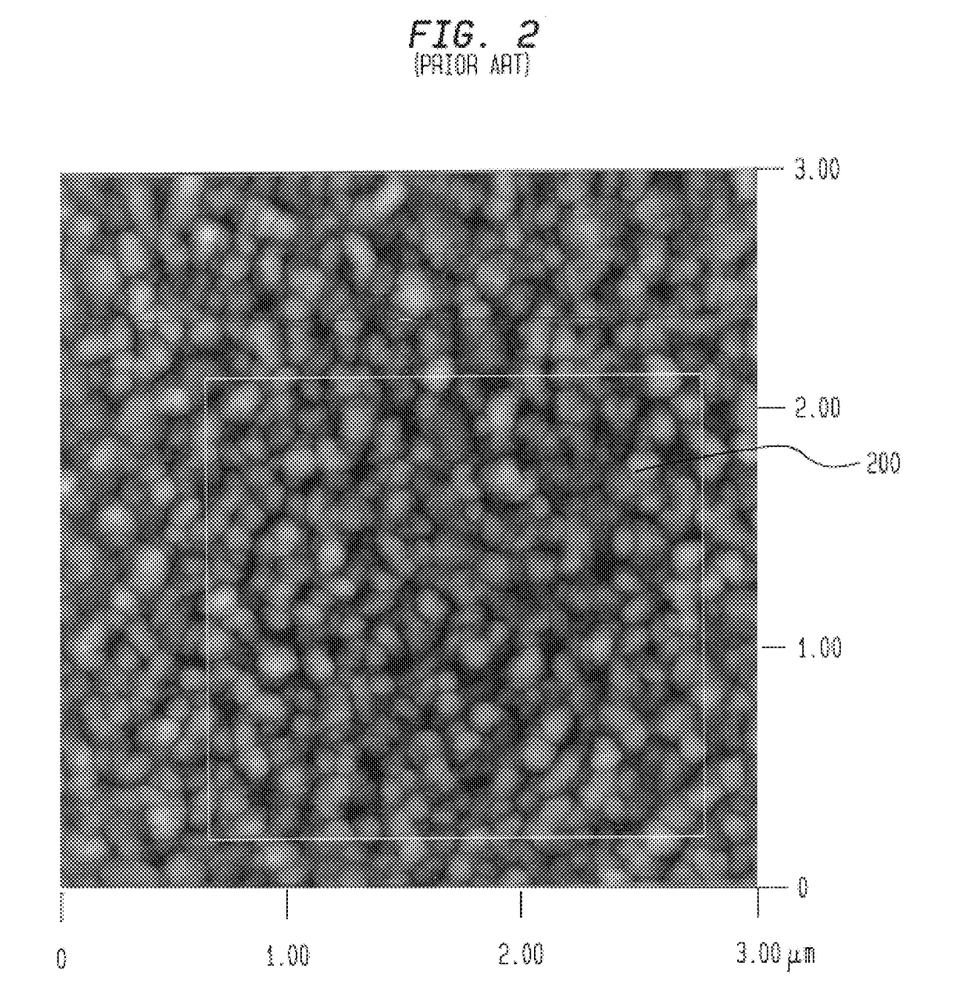
FIG. 2 depicts an atomic force microscope photograph of a copper layer deposited according to the prior art.

FIG. 2 depicts an atomic force microscope (AFM) photograph of the copper seedlayer produced during a conventional copper sputtering process. The image shows a fairly rough surface, which is quantitatively indicated by the data "Mean Roughness" (Ra) value of 3.454 nm. This value indicates that the mean size of the features in FIG. 2 is 3.454 nm in diameter. The box 200 is the region over which the Ra was calculated. Box 200 has dimensions of 2.090 μm on one side and 1.943 μm on the other.

Figure 3:
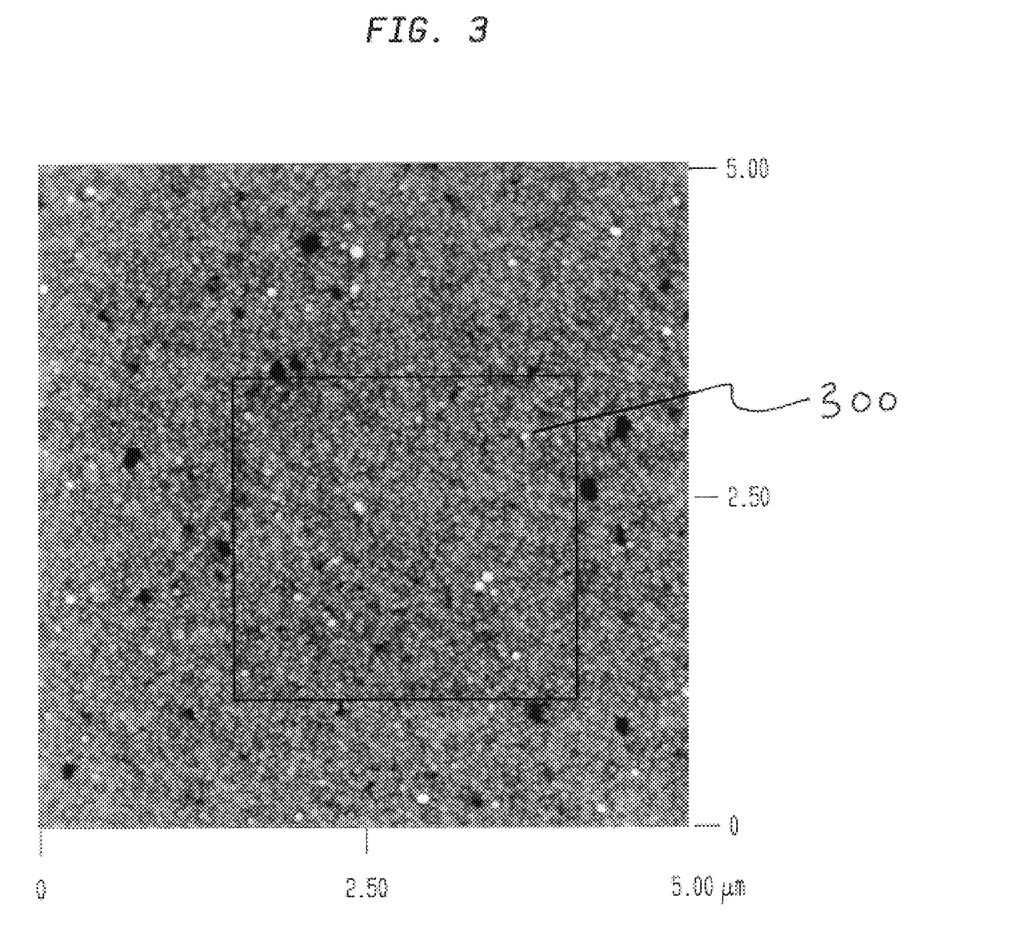
FIG. 3 depicts an atomic force microscope photograph of a copper layer deposited according to the present invention.

FIG. 3 depicts an AFM photograph of the copper seedlayer produced during the sputtering process of the present invention. The image shows a finer structure than that depicted in FIG. 2. The Mean Roughness value of this layer is only 0.849 nm, significantly less than 3.454 nm, the Ra value obtained using the conventional sputtering process at warmer temperatures. The box 300 is the region over which the Ra was calculated, and has dimensions of 2.583 μm and 2.427 μm. Although the data of FIG. 3 were obtained using a different magnification, the Ra value is not affected by the magnification or the differing test area. Moreover, the Ra value provides a way to directly and quantitatively compare the two results.

Figure 4A:
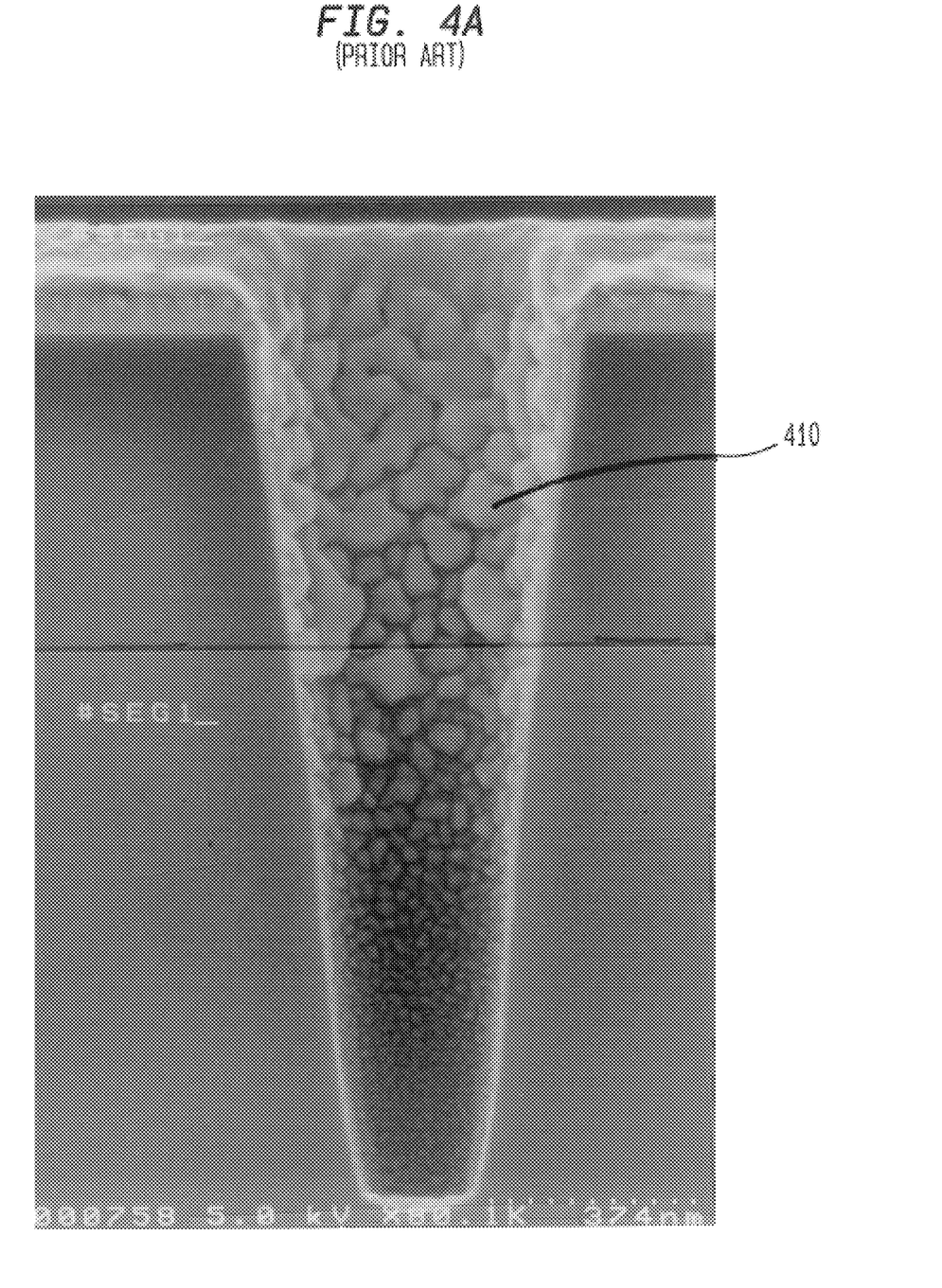
FIG. 4A depicts a scanning electron microscope photograph of a cross section of a structure after copper layer deposition according to the prior art.

FIG. 4A depicts a SEM photograph of a cross section of a void after copper sputtering at conventional temperatures. The structure depicted in this figure is a tapered hole, etched into a dielectric material such as an oxide (a typical example being silicon dioxide). All of the depictions in FIGS. 4A through 7E are of these structures, or voids, after cleaving and imaging perpendicular to the surface of the wafer.

Figure 4B:
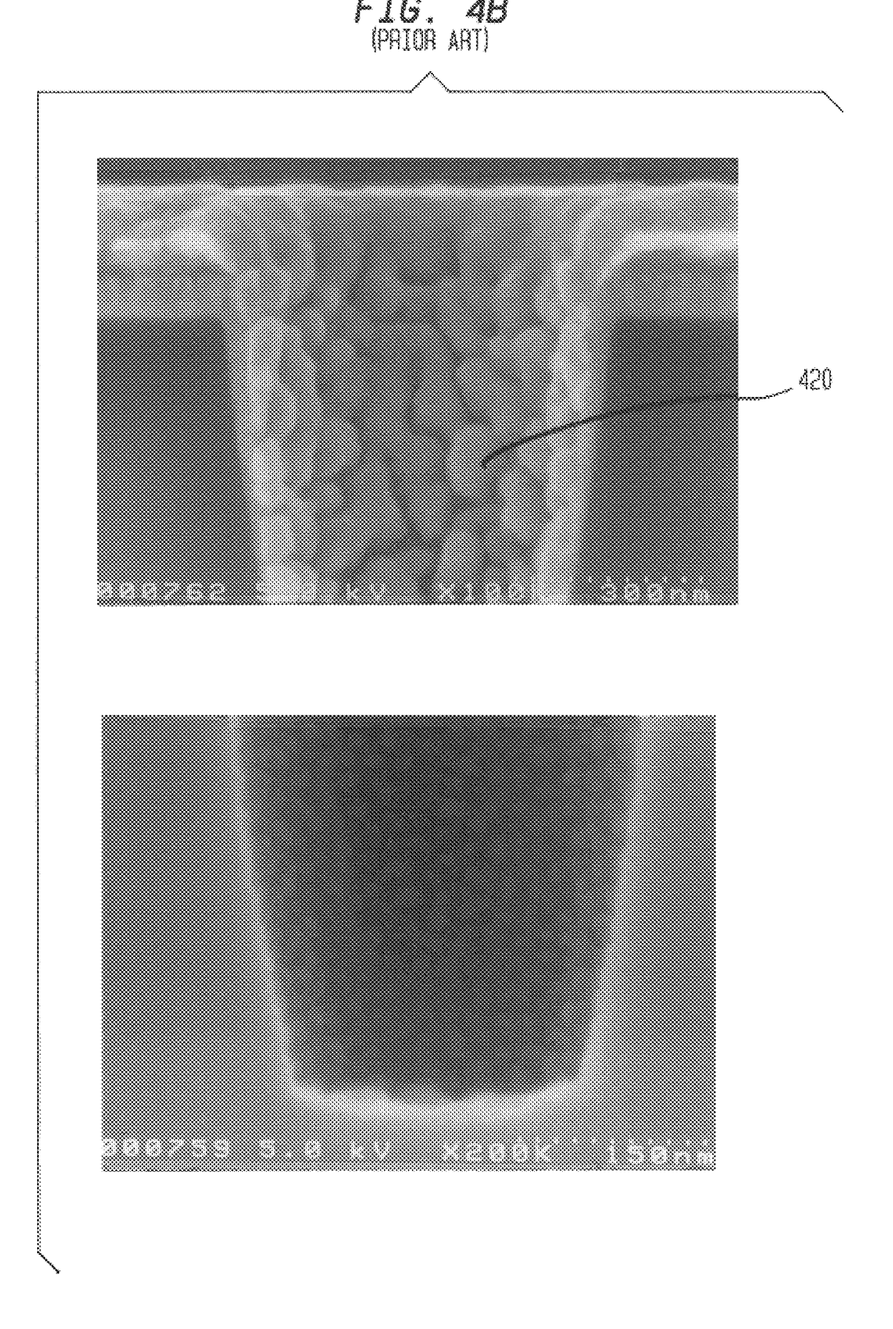
FIG. 4B depicts a different scanning electron microscope photograph of a cross section of a structure after copper layer deposition according to the prior art.

FIG. 4B is a second depiction of a void after copper sputtering at conventional temperatures under slightly greater magnification than FIG. 4A. In these SEM photographs, the copper is agglomerated. Two examples of such irregularities are indicated as agglomerations 410 and 420.

Figure 5A:
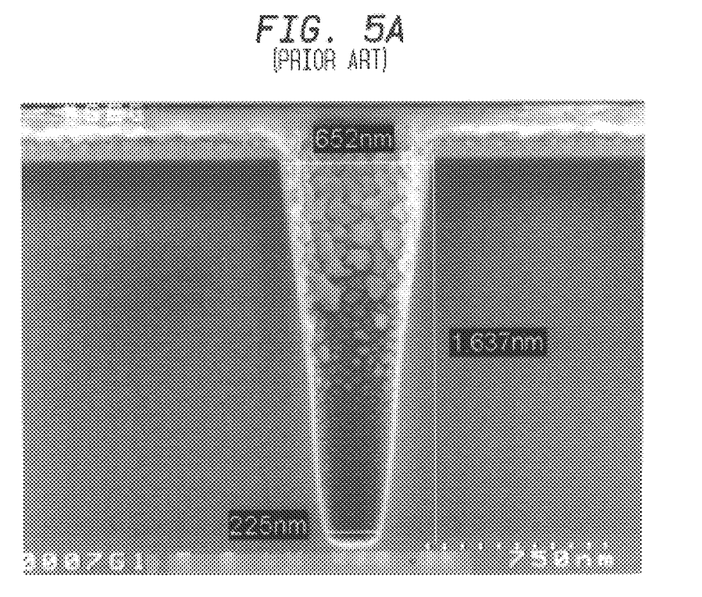
FIGS. 5A–5E are additional depictions of scanning electron microscope photographs of cross sections of structures after copper layer deposition performed according to the prior art.
Figure 5B:
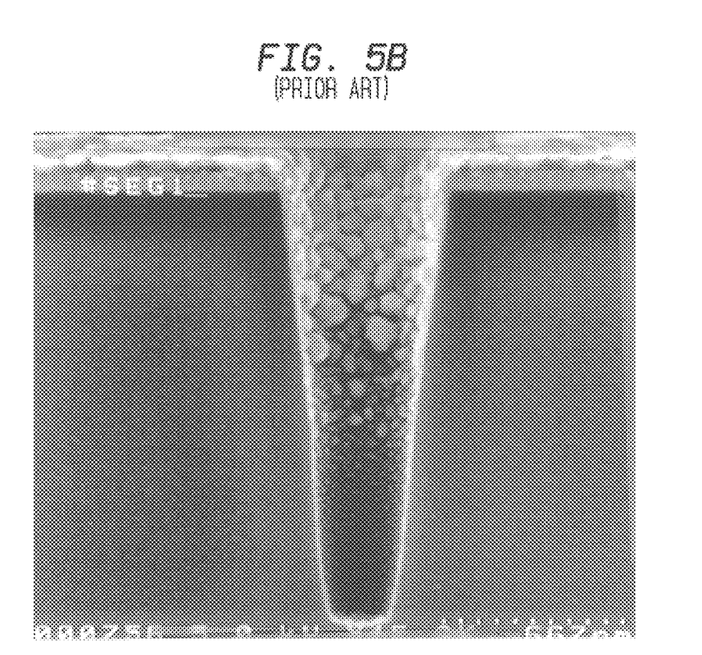
Figure 5C:
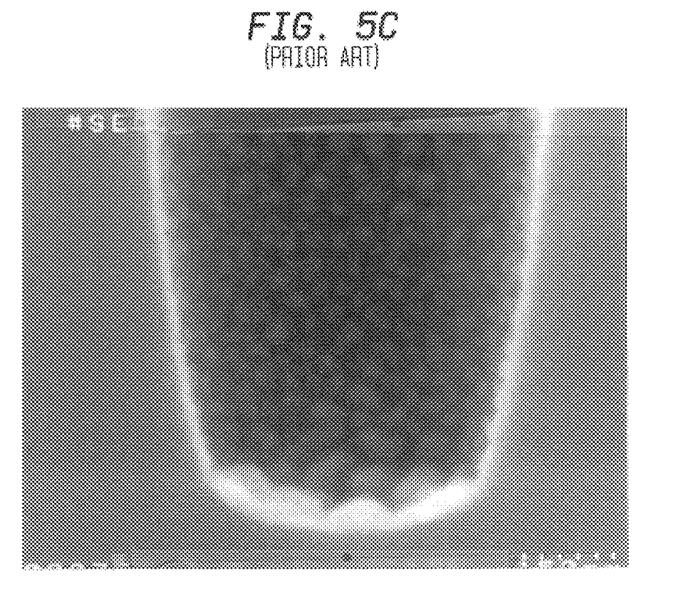
Figure 5D:
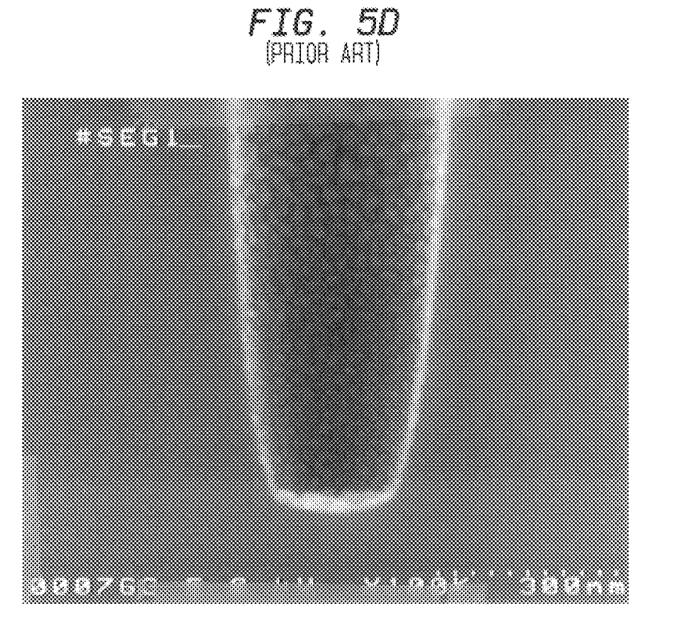
Figure 5E:
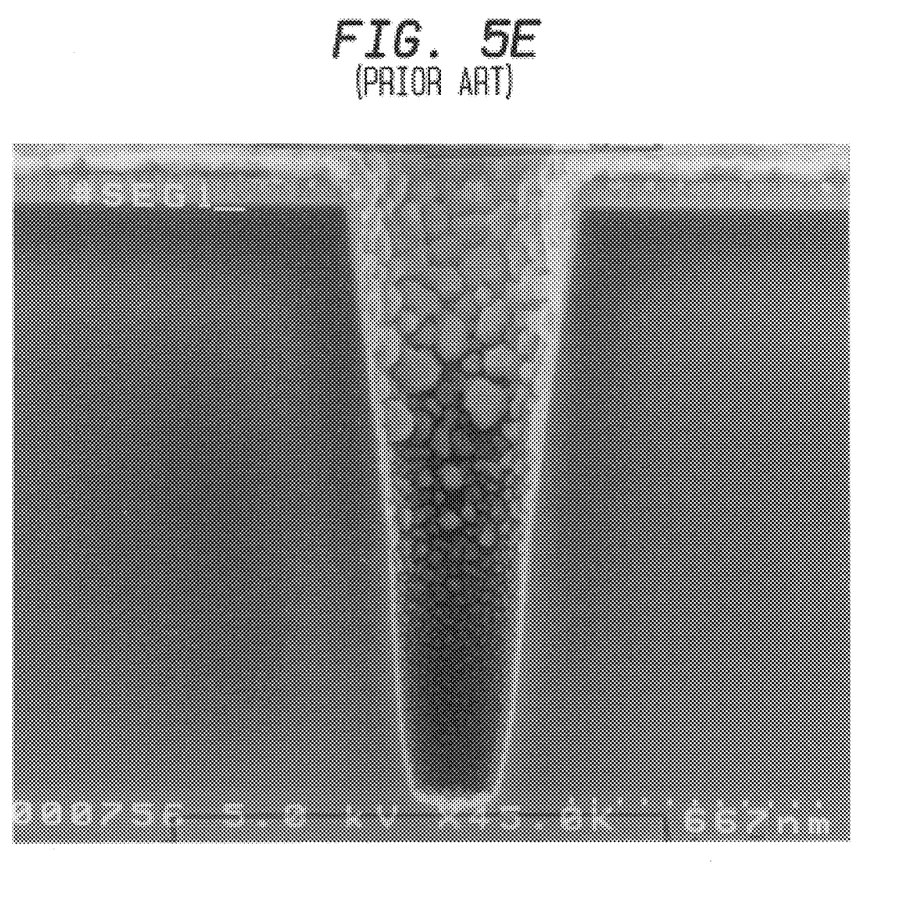

FIGS. 5A through 5E show additional depictions of SEM photographs of voids after copper sputtering at conventional temperatures according to conventional techniques. One notes the relatively rough appearance at the inside surface of each void, especially at the upper regions of each void. FIG. 5A indicates dimensions of the void. The opening diameter is 652 nm, the depth is 1.637 nm, and the diameter just above the bottom, which actually is a concave bottom, is 225 nm.

These numbers are given simply for information and perspective of the agglomerations, and are not intended to in any way limit the scope of this invention.

Figure 6A:
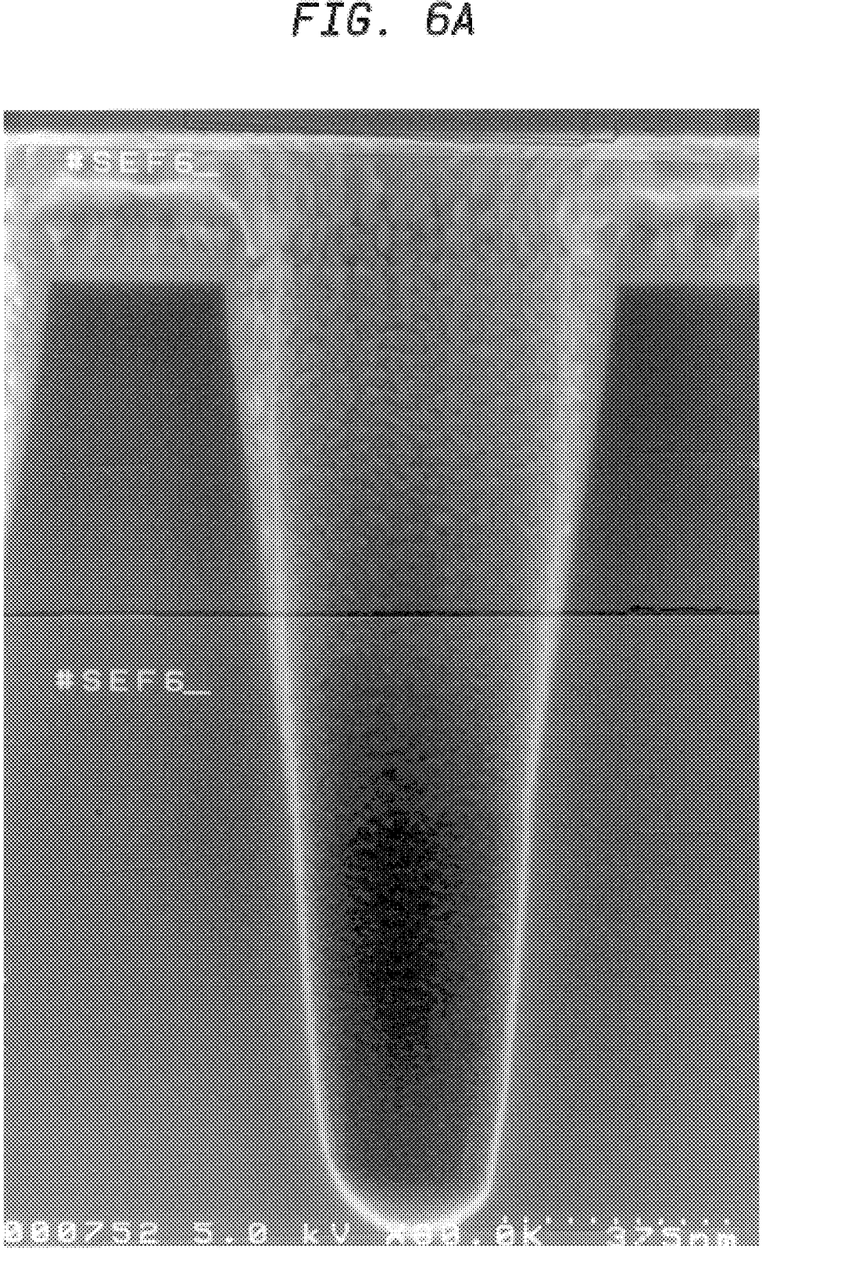
FIG. 6A depicts a scanning electron microscope photograph of a cross section of a structure after copper layer deposition according to the present invention.
Figure 6B:
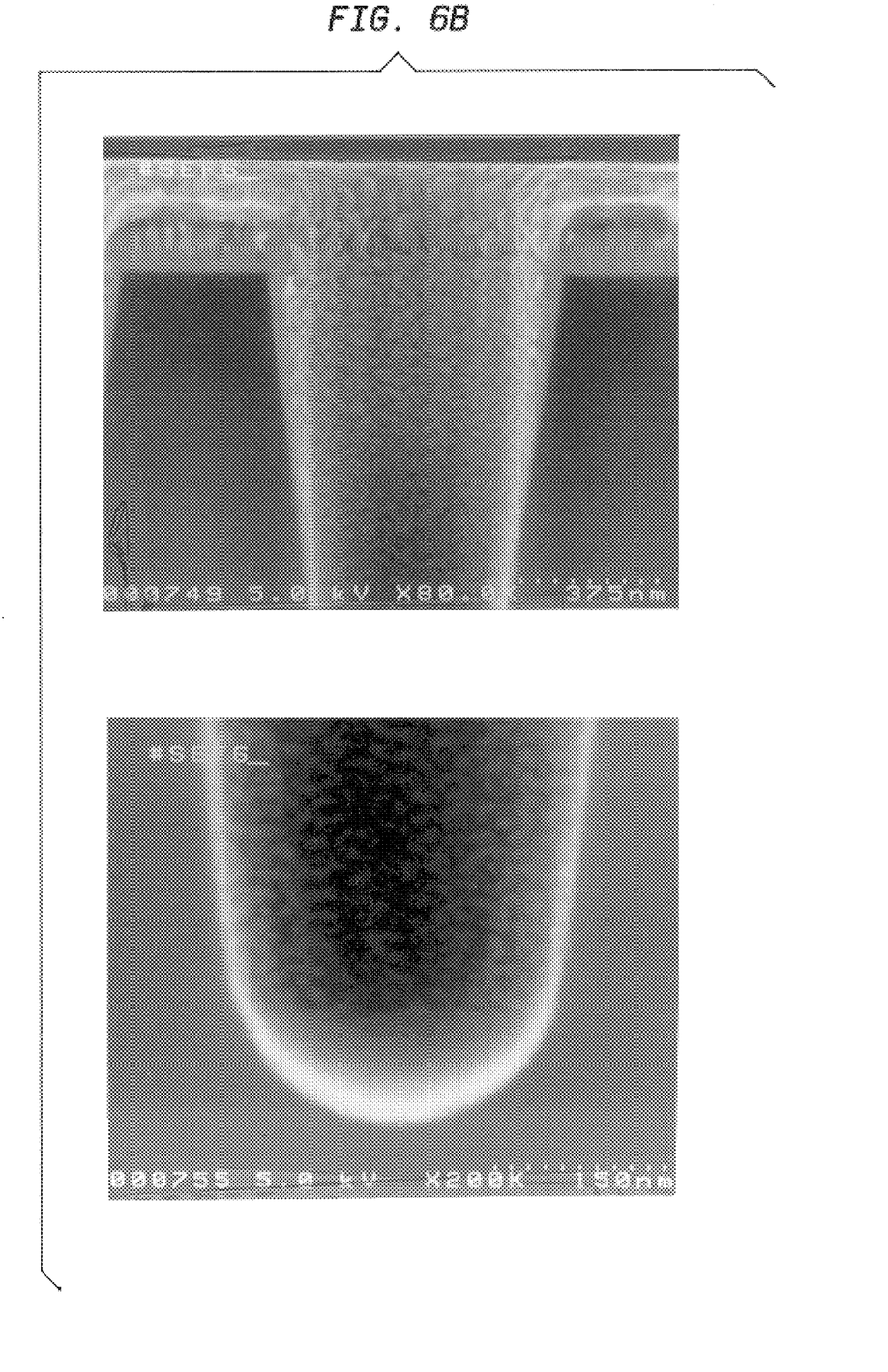
FIG. 6B depicts a different scanning electron microscope photograph of a cross section of a structure after copper layer deposition according to the present invention.

FIGS. 6A and 6B show the results of the copper sputtering when the deposition is conducted at near cryogenic temperatures according to the present invention. The copper accumulations are much smaller than those shown in FIGS. 4A through 5E. This smoother, more consistent film is the result of performing the sputtering process at the colder temperatures according to the present invention. The inventors believe the smaller particle sizes are a result of the lowered copper atom mobility at the colder temperatures.

Figure 7A:
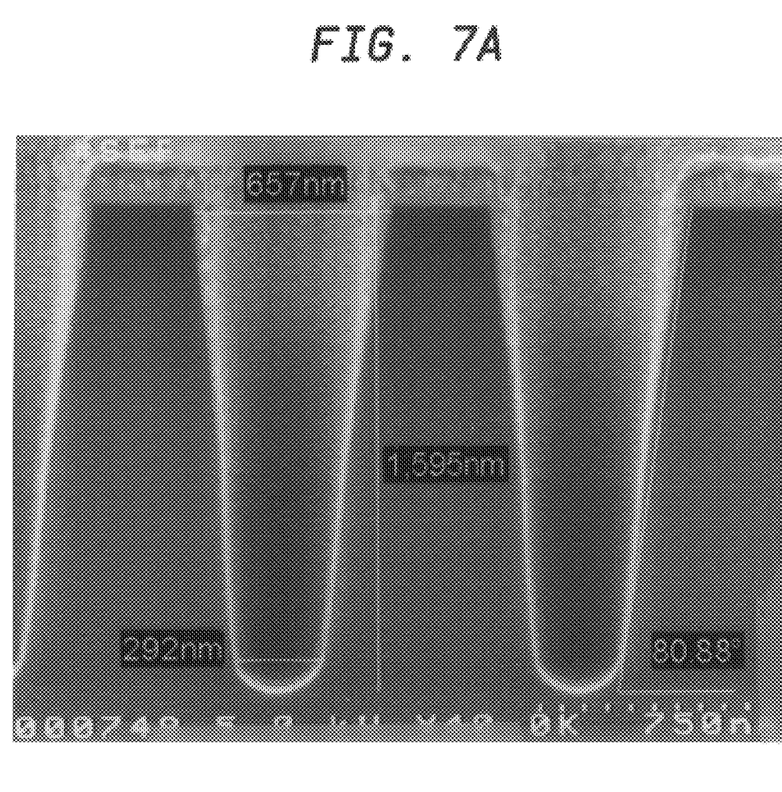
FIGS. 7A–7E are additional depictions of scanning electron microscope photographs of cross sections of structures after copper layer deposition performed according to the present invention.
Figure 7B:
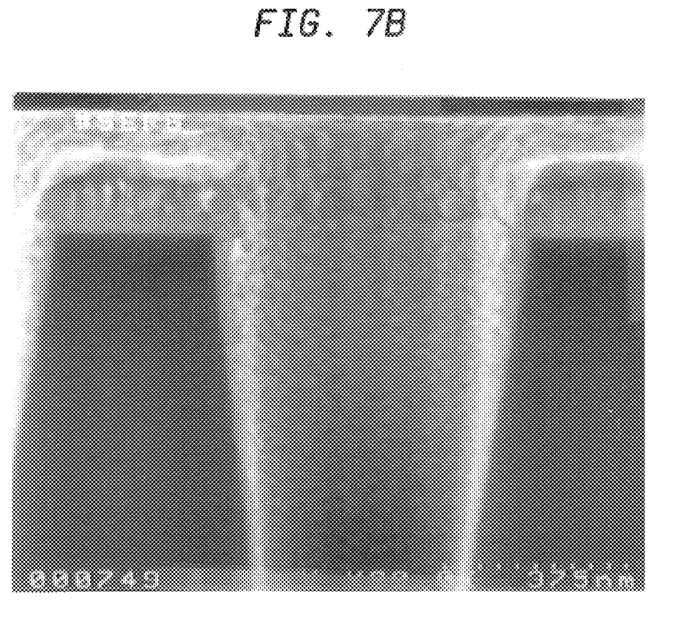
Figure 7C:
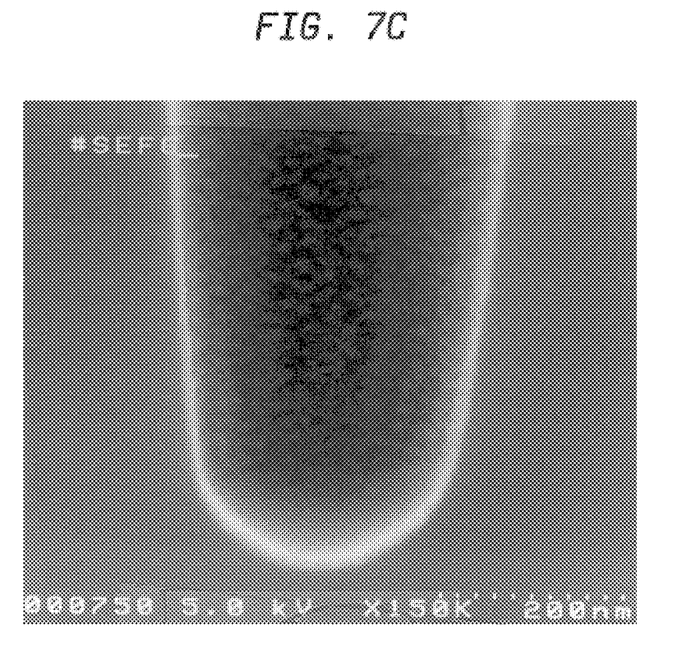
Figure 7D:
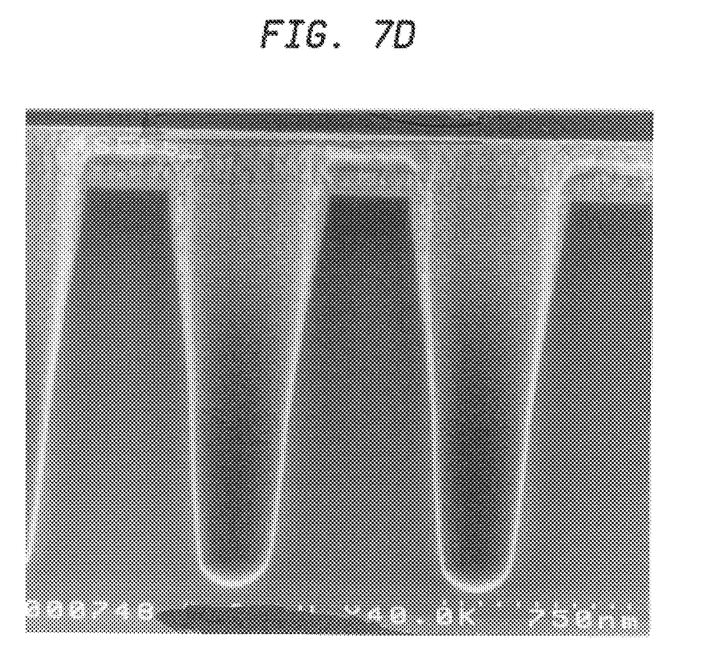
Figure 7E:
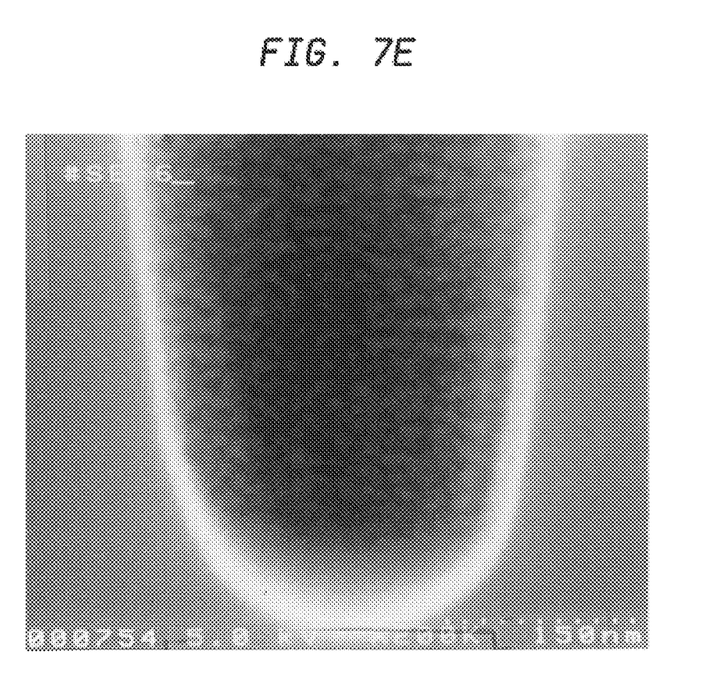

FIGS. 7A through 7E show other depictions of SEM photographs of the improved copper morphology which results from sputtering performed according to the present invention. FIG. 7A provides dimensions of the structure, which again allow a perspective of the accumulations. Both the dimensions and the accumulations, when compared to those of FIG. 5A, show that the copper sputtering process of the present invention reduces copper agglomeration.

Like FIG. 5A, FIG. 7A indicates dimensions of the structure. The opening diameter is 657 nm, the depth is 1.595 nm, and the diameter just above the bottom, which actually is a concave bottom, is 292 nm. In addition to these dimensions, the angle shown in FIG. 7A as that formed by the side of the void with respect to a plane parallel to the top surface of the wafer, is 80.88°.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for reducing the agglomeration of copper particles during the deposition of copper onto a substrate comprising:

mounting the substrate on a chuck;

cooling the chuck and the substrate to a temperature of less than −25° C.; and depositing the copper onto the cooled substrate while maintaining the temperature of the chuck and the substrate at less than −25° C.

2. The process of claim 1 wherein the cooling step includes pumping liquid nitrogen through the chuck.

3. The process of claim 1 wherein the substrate is a semiconductor wafer.

4. The process of claim 1 wherein the copper is deposited using sputter deposition.

5. The process of claim 1 wherein the chuck and the substrate are cooled to and maintained at a temperature less than −100° C.

6. The process of claim 1 wherein the substrate has a high aspect ratio structure.

7. A process for reducing the agglomeration of copper particles during the deposition of copper onto a substrate comprising:

mounting the substrate on a chuck;

passing a cryogenic fluid through the chuck to cool the chuck and the substrate to a temperature of less than −25° C.; and depositing copper onto the cooled substrate using a sputter deposition process while maintaining the temperature of the chuck and the substrate at less than −25° C.

8. The process of claim 7 wherein the cooling step includes pumping liquid nitrogen through the chuck.

9. The process of claim 7 wherein the substrate is a semiconductor wafer having a high aspect ratio structure.

10. A process for reducing the agglomeration of copper particles during the deposition of copper onto a semiconductor wafer having a high aspect ratio structure, the process comprising the steps of:

mounting the semiconductor wafer on a wafer chuck;

passing liquid nitrogen through the wafer chuck to cool the wafer chuck and the semiconductor wafer to a temperature less than −100° C.; and depositing copper onto the cooled wafer using a sputter deposition process while maintaining the temperature of the wafer chuck and the semiconductor wafer less than −100° C.

11. An apparatus for reducing the agglomeration of copper particles during the deposition of copper onto a semiconductor wafer substrate comprising:

a physical vapor deposition vessel;

a copper source plate located in the physical vapor deposition vessel;

a wafer chuck located in the physical vapor deposition vessel at a distance from the copper source plate and adapted to receive the substrate;

a source of cryogenic fluid; and a line disposed through the wafer chuck carrying the cryogenic fluid from the source through the wafer chuck to cool the wafer chuck and the substrate to a temperature below −25° C.

12. The apparatus of claim 11 wherein the cryogenic fluid is liquid nitrogen.

13. The apparatus of claim 11 wherein the wafer chuck is stainless steel.

14. The apparatus of claim 11 wherein the substrate has a high aspect ratio structure.

* * * * *

UNITED STATES PATENT AND TRADEMARK OFFICE
CERTIFICATE OF CORRECTION

PATENT NO. : 6,210,541 B1  Page 1 of 1
DATED : April 3, 2001
INVENTOR(S) : Edward C. Cooney III et al.

It is certified that error appears in the above-identified patent and that said Letters Patent is hereby corrected as shown below:

<u>Title page,</u>
ABSTRACT,
Line 5, delete "+20°C" and insert -- -20°C --.

Signed and Sealed this

Eighth Day of January, 2002

*Attest:*

*Attesting Officer*

JAMES E. ROGAN
*Director of the United States Patent and Trademark Office*